(12) United States Patent
Matsuura et al.

(10) Patent No.: US 9,786,731 B2
(45) Date of Patent: Oct. 10, 2017

(54) DISPLAY DEVICE AND METHOD FOR MANUFACTURING SAME

(71) Applicant: SAMSUNG DISPLAY CO., LTD., Yongin-si, Gyeonggi-Do (KR)

(72) Inventors: Toshiyuki Matsuura, Yokohama (JP); Mitsuhiro Kashiwabara, Yokohama (JP)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/074,116

(22) Filed: Mar. 18, 2016

(65) Prior Publication Data

US 2016/0284785 A1    Sep. 29, 2016

(30) Foreign Application Priority Data

Mar. 23, 2015    (JP) ................. 2015-059520

(51) Int. Cl.
*H01L 27/32*    (2006.01)
*H01L 51/52*    (2006.01)

(52) U.S. Cl.
CPC ...... *H01L 27/3276* (2013.01); *H01L 51/5228* (2013.01)

(58) Field of Classification Search
CPC .. H01L 27/3276; H01L 51/56; H01L 27/3246
See application file for complete search history.

(56) References Cited

U.S. PATENT DOCUMENTS 8,928,018 B2 *   1/2015   Ikeda ................. H01L 27/3276
                                                        257/98
2004/0021425 A1   2/2004   Foust et al.
2009/0302751 A1  12/2009   Hanawa

FOREIGN PATENT DOCUMENTS

| EP | 1881366     | 1/2008  |
|----|-------------|---------|
| JP | 2001195008  | 7/2001  |
| JP | 2001230086  | 8/2001  |
| JP | 2005011810  | 1/2005  |
| JP | 2005093398  | 4/2005  |
| JP | 2009244527  | 10/2009 |
| JP | 2011-203742 | 10/2011 |

* cited by examiner

*Primary Examiner* — William Coleman
(74) *Attorney, Agent, or Firm* — F. Chau & Associates, LLC

(57) ABSTRACT

A display device includes a substrate. A pixel electrode is disposed on the substrate. An auxiliary electrode is disposed on the substrate. A first auxiliary line is connected to the auxiliary electrode. A second auxiliary line is spaced apart from the auxiliary electrode. A top electrode contacts at least one of the auxiliary electrode, the first auxiliary line, or the second auxiliary line. An organic light emitting layer is disposed between the top electrode and the pixel electrode, and is disposed between the top electrode and the first and second auxiliary lines.

20 Claims, 13 Drawing Sheets

FIG. 6

| Embodiment of example | Applied Voltage (V) | Opening Fraction (%) | Maximum Opening Diameter (μm) | Emission Deficiency |
|---|---|---|---|---|
| First | 30 | 50 | 7 | None |
| Second (2.5 μm) | 50 | 45 | 10 | None |
| Second (4.0 μm) | 60 | 45 | 15 | None |
| Second (6.0 μm) | 60 | 40 | 20 | None |

DISPLAY DEVICE AND METHOD FOR MANUFACTURING SAME

CROSS-REFERENCE TO RELATED APPLICATIONS

This U.S. non-provisional patent application claims priority under 35 U.S.C. §119 to Japanese Patent Application No. 2015-059520, filed on Mar. 23, 2015, the entire contents of which are hereby incorporated by reference.

TECHNICAL FIELD

The present disclosure herein relates to a display device, and more particularly, to a display device and a method for manufacturing the display device.

DISCUSSION OF THE RELATED ART

Recently, light emitting diodes such as organic electroluminescence diodes (organic EL diodes) are being developed.

For example, active-matrix driven organic electroluminescence (EL) display devices are being developed Active-matrix driven organic EL display devices display images by regulating a flow of current through thin film transistors (TFT) disposed on each pixel. The flow of current is used to illuminate the organic light emitting diodes.

Organic EL diodes have been developed with a top emission configuration in which the direction of light emitted from the light emitting diodes is configured to be in a direction opposite to the TFT side of the diode. This configuration prevents a decrease in light transmittance which is otherwise due to the light passing through the TFT circuit, which tends to reduce the opening fraction of each of the pixels.

In the organic EL display device with the top emission configuration, the electrode (hereinafter, top electrode) is generally formed on the side of the emitting direction (that is, the side that is opposite to the TFT side) of the light emitting diode. The top electrode is made of a thin film of metal or transparent conductive oxide such that the electrode is optically transmissive.

However, since the electrode formed by using the thin film of metal or transparent conductive oxide has a large resistance, a voltage drop is generated, and irregularities in brightness are generated in the display of the display device. These irregularities in brightness become more pronounced as the current is increased to increase the brightness of the image and as the display device becomes larger. Accordingly, a variety of techniques for suppressing the voltage drop that is generated in the top electrode are being considered.

SUMMARY

Exemplary embodiments of the present invention provide a technique for connecting an auxiliary line to a top electrode in an organic EL display device with a top emission configuration.

An exemplary embodiment of the inventive concept provides a display device including a substrate. A pixel electrode is disposed on the substrate. An auxiliary electrode is also disposed on the substrate. A first auxiliary line is connected to the auxiliary electrode. A second auxiliary line is spaced apart from the auxiliary electrode. A top electrode contacts the auxiliary electrode, the first auxiliary line, and/or the second auxiliary line. An organic light emitting layer is disposed between the top electrode and at least the pixel electrode, and is disposed between the top electrode and the first and second auxiliary lines.

An exemplary embodiment of the inventive concept provides a method for manufacturing a display device. The method includes forming a pixel electrode on a substrate. An auxiliary electrode is formed on the substrate. A first auxiliary line is connected to the auxiliary electrode. A second auxiliary line is spaced apart from the auxiliary electrode. An organic light emitting layer is formed on the pixel electrode, the auxiliary electrode, the first auxiliary line, and the second auxiliary line. A discharge effect is generated between the auxiliary electrode and the second auxiliary line. A top electrode is formed such that the top electrode contacts the auxiliary electrode, the first auxiliary line, and/or the second auxiliary line.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein:

FIG. 6 is a chart illustrating a comparative evaluation of display devices according to exemplary embodiments of the present inventive concept.

DETAILED DESCRIPTION

Figure 1:
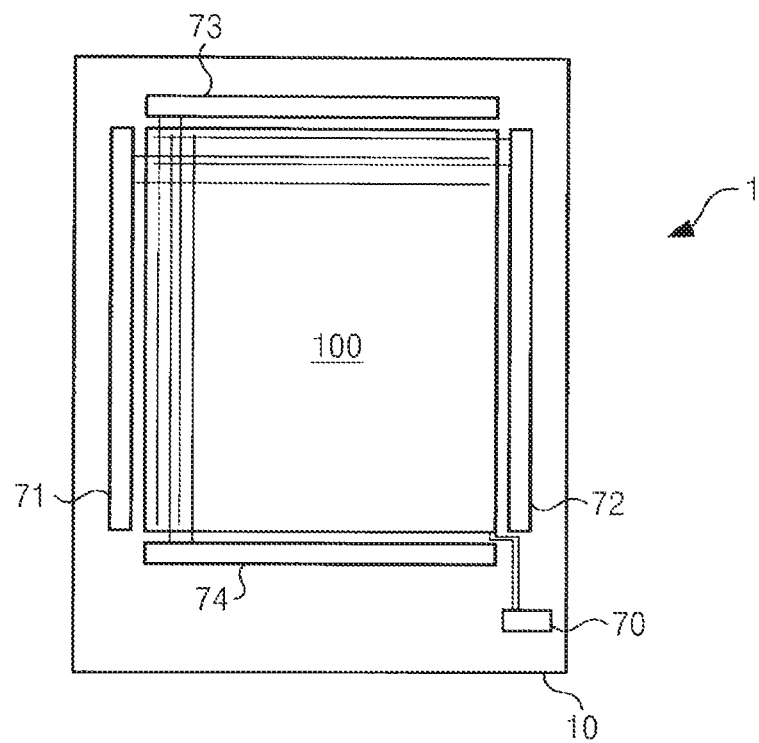
FIG. 1 is a schematic diagram illustrating a configuration of a display device according to an exemplary embodiment of the present inventive concept.

Hereinafter, a display device according to an exemplary embodiment of the present inventive concept will be explained in detail with reference to the accompanying drawings. Moreover, that which is described below is merely an exemplary embodiment of the inventive concept, and the inventive concept should not be construed as limited to such embodiments.

In the accompanying drawings, identical parts or parts having identical functions may be assigned identical or similar (e.g. a common number followed by different letters or other symbols such as "A" or "B" added to the numerals) reference labels, and in some cases, duplicate descriptions thereof will not be given. Moreover, for effective description, the dimensions in the drawings may differ from the actual dimensions, and some elements may be excluded from the drawings. In addition, when a first element is referred to as being "formed on a second element" or "disposed on a second element", this may mean that the first element directly contacts the second element or that other intervening elements are formed or disposed between the first element and the second element.

FIG. 1 is a schematic diagram illustrating a configuration of a display device according to an exemplary embodiment of the inventive concept.

Referring to FIG. 1, a display device 1 may be a top emission-type organic electroluminescence display. The display device 1 may be included in an electronic device such as a smart phone, a mobile phone, a personal computer, a television, or the like. The display device 1 is configured to display images.

Various elements for driving the display device 1 may be formed on a substrate 10. A display 100, driver circuits 71, 72, 73, and 74, and a voltage applying part 70 may be included in the substrate 10.

Figure 2:
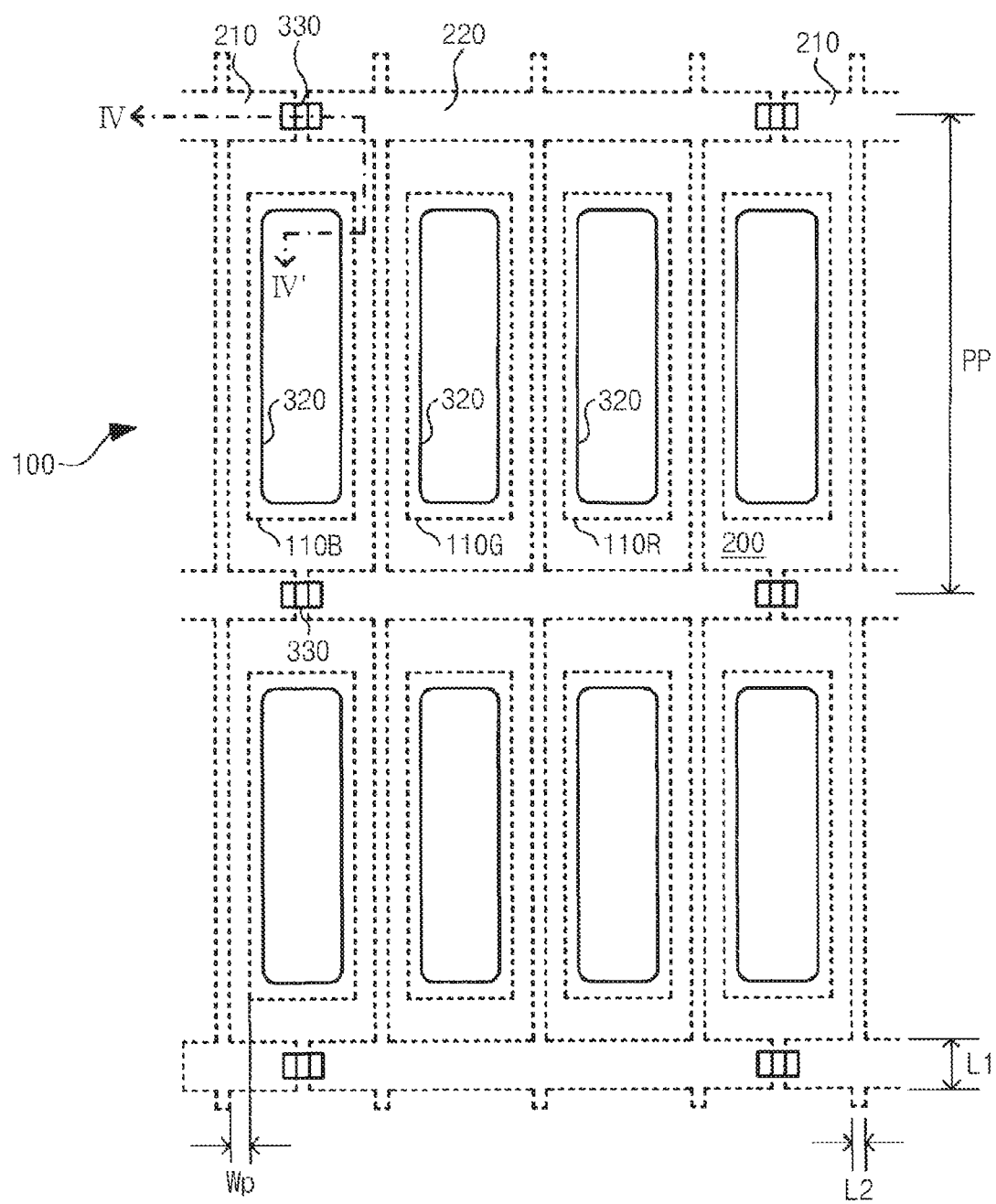
FIG. 2 is a diagram illustrating a layout of an auxiliary line, pixels, and a related structure, of a display device according to an exemplary embodiment of the present inventive concept.

FIG. 2 is a diagram illustrating a layout of an auxiliary line and pixels, and related structure according to an exemplary embodiment of the present inventive concept. In FIG. 2, some elements were excluded in order to clearly illustrate the layout of the auxiliary line and pixels, and the like, in the display 100.

Referring to FIG. 2, pixel electrodes 110B, 110G, and 110R respectively correspond to pixels producing blue, green, and red light. Each of the pixel electrodes 110B, 110G, and 110R is connected to the pixel circuit, which is formed by using a thin film transistor TFT. The pixel pitch PP may be, for example, about 145 μm to about 636 μm. However, the pixel pitch PP is not limited to such values.

Each of a first auxiliary line 210 and a second auxiliary line 220 is a separately formed auxiliary line. The first auxiliary line 210 and the second auxiliary line 220 are disposed to surround the pixel. In an exemplary embodiment of the present inventive concept, each of the first and second auxiliary lines 210 and 220 may extend in a column direction that is parallel with a column direction, and the first and second auxiliary lines 210 and 220 may be spaced apart in a row direction that is perpendicular to the column direction.

In FIG. 2, the first auxiliary line 210 and the second auxiliary line 220 are disposed between the pixels. Moreover, the first auxiliary line 210 and the second auxiliary line 220 may be provided between at least some of the pixels. The line width L1 of the first auxiliary line 210 and the line width L2 of the second auxiliary line 220 may be 66 μm and 22 μm, respectively. However, the line width L1 of the first auxiliary line 210 and the line width L2 of the second auxiliary line 220 are not limited to such values.

The pixel electrodes 110B, 110G, and 110R, the first auxiliary line 210, and the second auxiliary line 220 may be formed by a conductive film. The pixel electrodes 110B, 110G, and 110R, the first auxiliary line 210, and the second auxiliary line 220 may all be in the same layer. In an exemplary embodiment of the present inventive concept, the conducting film may be formed by laminating a metal alloy (for example, AgPdCu) in a bottom layer and a transparent conductive oxide (for example, indium tin oxide (ITO)) in a top layer. Moreover, at least one of the first auxiliary line 210 or the second auxiliary line 220 may also be formed by a conductive layer that is in a different layer to the pixel electrodes 110B, 110G, and 110R. Furthermore, in order to simplify the manufacturing process, the pixel electrodes 110B, 110G, and 110R, the first auxiliary line 210, and the second auxiliary line 220 may all be formed at the same time by using the same materials. The first auxiliary line 210 and the second auxiliary line 220 may be formed at the same time as a conductive film other than the pixel electrodes 110B, 110G, and 110R.

An insulating layer 200 functions as a pixel separation film. For example, the insulating layer may expose a portion of each of the pixel electrodes 110B, 110G, and 110R, and the first auxiliary line 210 and the second auxiliary line 220, and cover some unexposed parts of each of the pixel electrodes 110B, 110G, and 110R, and the first auxiliary line 210 and the second auxiliary line 220. The insulating layer 200 may include, for example, an organic resin such as polyimide, and the like.

On the insulating layer 200 are provided a first opening 320 exposing a portion of each of the pixel electrodes 110B, 110G, and 110R, the first auxiliary line 210, and the second auxiliary line 220, and a second opening 330 exposing a portion of a below-described auxiliary electrode. The first opening 320 forms an area that corresponds to an organic light emitting layer of each of the pixel electrodes 110B, 110B, and 110R and the first opening 320 is configured to generate a current that flows to the organic light emitting layer. The second opening 330 is provided to enable a top electrode covering the organic light emitting layer to connect to at least one of the first auxiliary line 210, the second auxiliary line 220, or the auxiliary electrode. As illustrated in FIG. 2, the second opening 330 may be disposed between the pixels or provided adjacent to any one of the pixel electrodes 110B, 110G, and 110R.

Figure 3:
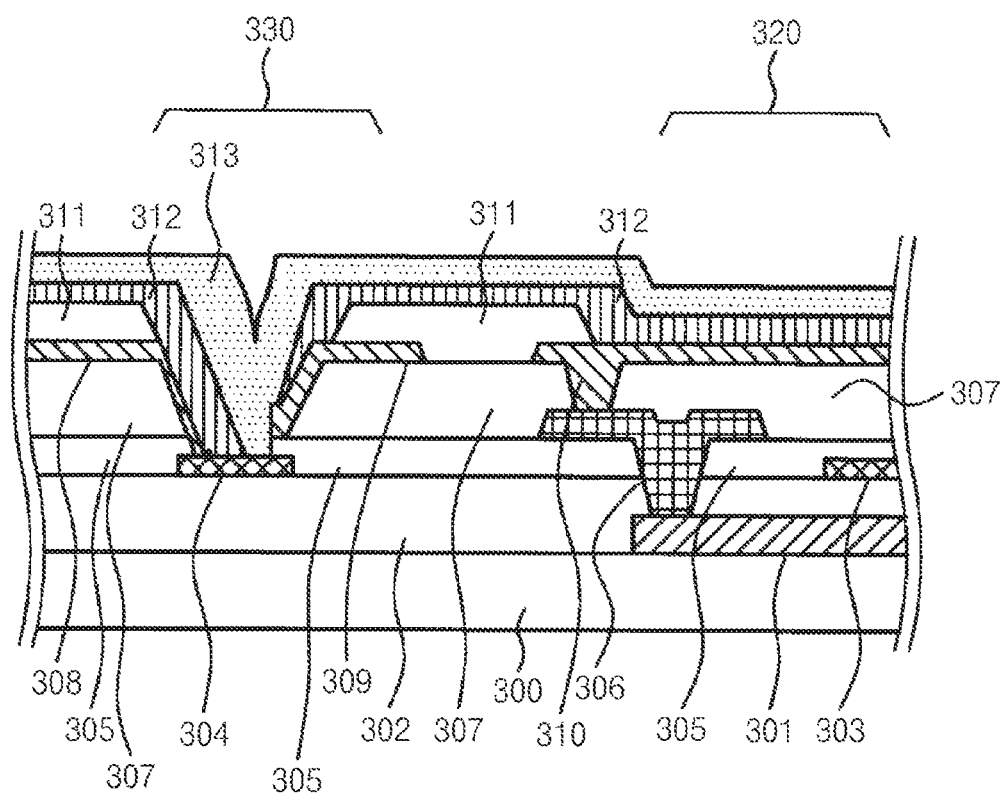
FIG. 3 is cross-sectional view along IV-IV' in FIG. 2 according to an exemplary embodiment of the present inventive concept.

FIG. 3 is a cross-sectional view along IV-IV' in FIG. 2.

Referring to FIG. 3, a semiconductor layer 301 of the thin film transistor (TFT) is disposed on the substrate 300 and is covered by a gate insulating film 302. The semiconductor layer 301 may, for example, have a thickness of about 50 nm and include polysilicon. A gate electrode 303 is disposed on the gate insulating film 302. The gate electrode 303 may, for example, have a thickness of about 150 nm, and a Mo-containing material may be used therein. Moreover, the auxiliary electrode 304 may also be disposed on the gate insulating film 302. Thus, the same material may be used to form the gate electrode 303 and the auxiliary electrode 304 at the same time. Consequently, when the thickness of the gate electrode 303 is about 150 nm, the thickness of the auxiliary electrode 304 may also be about 150 nm. Moreover, silicon oxide having a thickness of about 100 nm may be used, for example, as the gate insulating film 302.

However, the auxiliary electrode 304 is not limited to being disposed on the gate insulating film 302. The auxiliary electrode 304 may be disposed on other layers. For example, the auxiliary electrode 304 may, like the semiconductor layer 301, be disposed on the substrate 300. In this case, the semiconductor layer may be doped with impurities to increase the conductivity of the semiconductor layer used for forming the auxiliary electrode 304. For example, the semiconductor layer 301 may consist of a semiconductor material, and the auxiliary electrode 304 may include the doped semiconductor material. Moreover, the auxiliary electrode 304 may be formed and disposed on an interlayer insulating film 305 at the same time as an electrode 306 (described below) is formed, by using the same material.

In FIG. 3, the gate electrode 303 is covered with the interlayer insulating film 305. The interlayer insulating film 305 may, for example, have a thickness of about 300 nm and may include silicon oxide.

A planarizing film 307 is formed on the interlayer insulating film 305. A drain and source electrode 306 (hereinafter referred to as the electrode) is formed on the interlayer insulating film 305. The electrode 306 is an electrode other than the gate electrode of the TFT. The bottom of the electrode 306 is connected to the top surface of the semiconductor layer 301 through openings in the interlayer insulating film 305 and the gate insulating film 302. Moreover, the planarizing film 307 is formed on both the interlayer insulating film 305 and the electrode 306. A pixel electrode 310 is formed on the planarizing film 307. The bottom surface of the pixel electrode 310 is connected to the top surface of the electrode 306 and is electrically connected to the electrode 306. Thus, by regulating the electric potential of the gate electrode 303, the TFT may be operated in the "ON" state and current may flow between the pixel electrode 310 and the top electrode 313 such that an organic light emitting layer 312 is illuminated.

Moreover, the planarizing layer 307 may, for example, have a thickness of about 2 μm and may include polyimide. In addition, the electrode 306 may, for example, have a thickness of about 100 nm to about 450 nm and may include a single layer of Ti and AlCu or multiple layers of AlCu and Ti laminated in sequence.

The pixel electrode 310 may be formed by laminating, for example, a silver alloy (for example, AgPdCu) for the bottom layer and a conductive oxide (for example, no) as the top layer.

The organic light emitting layer 312 may, for example, be formed through vacuum deposition after performing an oxygen plasma treatment on the surface of the pixel separation film 311. The organic light emitting layer 312 has a multilayered configuration comprising a plurality of organic light emitting layers and, for example, may be a laminated configuration of, in sequence from the bottom layer to the top layer, 4,4',4"-tris(3-methyl-phenylphenylamino)tri-phenylamine (m-MTDATA), n,n-di(naphthalene-1-yl)-n,n-diphenyl-benzidene (NPB), Blue EML, and tris(8-hydroxyquinolinato)aluminium (Alq). Moreover, Blue EML may be disposed on the pixel electrode 310 of the pixel that emits blue light. Moreover, Blue EML need not be disposed in other locations. More specifically, the organic light emitting layer 312 may be formed by laminating in sequence from the bottom, a 4,4',4"-Tris(3-methyl-phenylphenylamino)tri-phenylamine (m-MTDATA) layer (film thickness of about 50 nm), a n,n-di(naphthalene-1-yl)-n,n-diphenyl-benzidene (NPB) layer (film thickness of about 70 nm), a light emitting layer (film thickness of about 30 nm), a tris(8-hydroxyquinolinato)aluminium (Alq3) layer (film thickness of about 30 nm), and a LiF layer (film thickness of about 1 nm). Here, the light emitting layer may be formed through codeposition of 9,10-Di(2-naphthyl)anthracene (ADN) and 5 mass percent, in terms of the total mass of the light emitting layer, of 4,4'-bis[2-{4-(n,n-diphenylamino)phenyl}vinyl]biphenyl (DPAVBi). Moreover, the organic light emitting layer may be formed on only the display area, and not on areas outside of the display area, such as a pad part configured for applying voltage.

The top electrode 313 is disposed on the organic light emitting layer 312. Consequently, the organic light emitting layer 312 is disposed between the top electrode 313 and the pixel electrode 310. The top electrode 313 may be disposed by a vacuum deposition method by using a layer of Ca (film thickness of about 2 nm), MgAg (Mg:Ag=10:1) as a first conductive layer. Here, a pattern may be formed by using a mask such that the first conductive layer also has the pad part configured for applying voltage. Moreover, the top electrode 313 may include a transparent conductive oxide such as ITO as the conductive layer.

In FIG. 3, a portion of the auxiliary electrode 304 surface is covered with the interlayer insulating film 305, and a second opening 330 is formed on the planarizing film 307 on the portion that is not covered by the interlayer insulating film 305 to correspond to the auxiliary electrode 304. The first auxiliary line 308 is disposed on a portion of a side wall of the second opening 330. Moreover, the first auxiliary line 308 is connected to the auxiliary electrode 304. In the second opening 330, the first auxiliary line 308 is electrically connected to the auxiliary electrode 304. Meanwhile, the second auxiliary line 309 is also disposed on another portion of the side wall of the second opening 330. However, in the second opening 330, the second auxiliary line 309 is disposed separately from the auxiliary electrode 304. Thus, in the second opening 330, the second auxiliary line 309 is neither directly connected nor electrically connected to the auxiliary electrode 304.

Thus, it is a characteristic of the interlayer insulating film 305 in FIG. 3 that, at the position indicated by the label 305, a step-shaped form having at least a step height that is due to the interlayer insulating film 305 is formed. The second auxiliary line 309 reaches the surface (e.g. the top surface) of the interlayer insulating film 305 that is equivalent to the tread of the step. Such a step height may be similar to the thickness of the interlayer insulating film 305. For example, the step height may be about 300 nm or less. Moreover, where desired, after disposing the interlayer insulating film 305, etching, and the like, may be performed on the surface of the interlayer insulating film 305 to reduce this step height. Consequently, the minimum step height may be 100 nm. In addition, by forming the interlayer insulating film 305 into a thin film, the minimum step height may be 50 nm.

Moreover, the above-described step-shaped form may also be formed by using the interlayer insulating film 305, and the flattening film 307 thereon. In this case, the step height may conversely be increased. For example, the step height may be about 2 μm or less.

Consequently, at least an insulating portion indicated by label 305 may be disposed between the auxiliary electrode 304 and the second auxiliary line 309. The thickness of the disposed insulating layer may be the above-described step height. Moreover, the step height may be set to the distance by which the second auxiliary line 309 is spaced apart from the surface of the auxiliary electrode 304.

As such, since the second auxiliary line 309 is spaced apart from the surface of the auxiliary electrode 304, a discharge effect may occur between the auxiliary electrode 304 and the second auxiliary line 309 during the manufacturing process of the display device. Voltage is applied to the first auxiliary line 308 and the second auxiliary line 309 to cause the discharge effect. Through this discharge effect, material in the organic light emitting layer 312 is filled into the second opening 330, and at least a portion of such material may melt, evaporate, burn, peel, or scatter. Consequently, when forming the top electrode 313, at least one of the first auxiliary line 210, the second auxiliary line 220, or the auxiliary electrode may be electrically connected to the top electrode 313.

By controlling the step height, for example, the distance by which the second auxiliary line 309 is spaced apart from the surface of the auxiliary electrode 304, the discharge effect may be generated to control the size and duration of the voltage that is applied to the first auxiliary line 308 and the second auxiliary line 309 when forming the top electrode 309. In particular, by reducing the thickness of the step height to about the thickness of the interlayer insulating film 305, both the size and duration of the voltage applied to the first auxiliary line 308 and second auxiliary line 309 are reduced. If the organic light emitting layer that is filled into the second opening 330 is scattered due to the discharge effect, the scattering distance may be reduced. Thus, a decline in the manufacturing yield of the display device may be prevented.

Figure 4A:
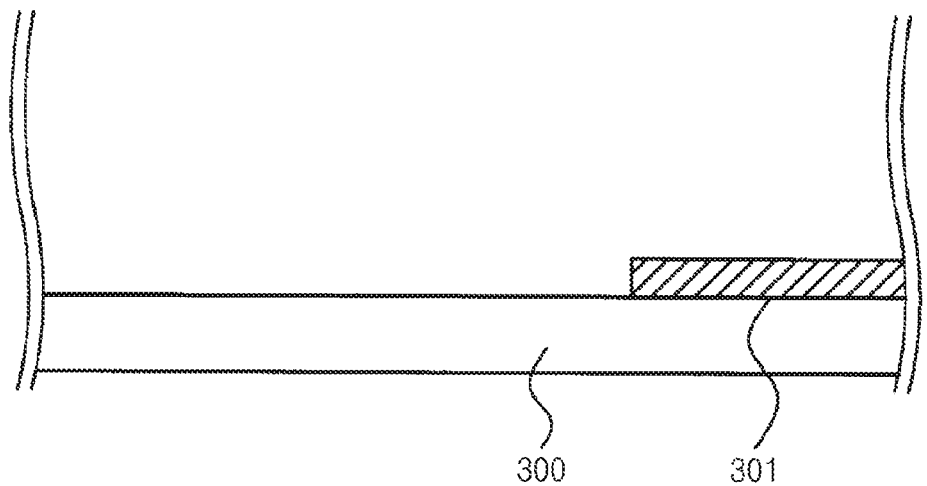
FIGS. 4A to 4P are diagrams illustrating a process for manufacturing a display device according to an exemplary embodiment of the present inventive concept.
Figure 4B:
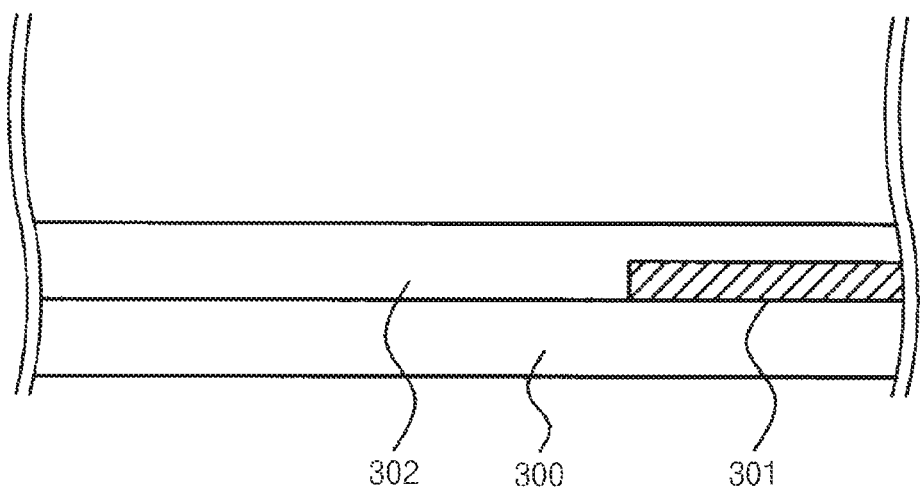
Figure 4C:
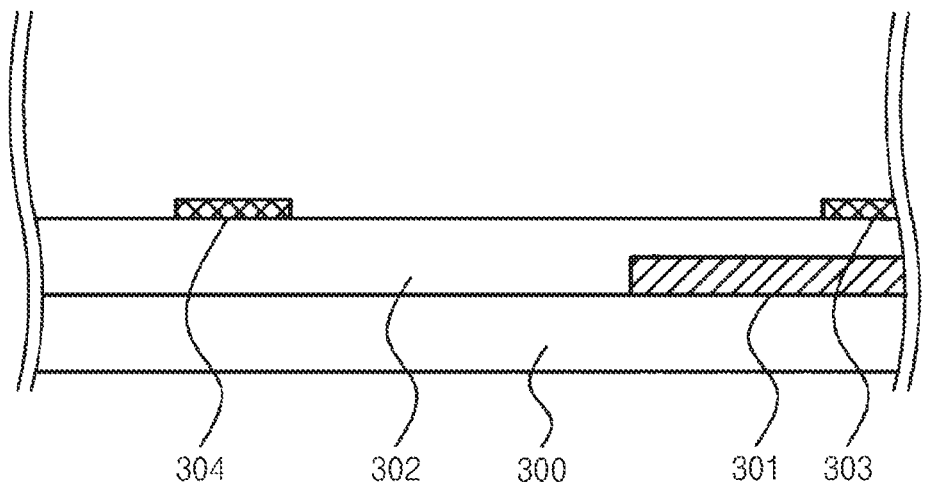
Figure 4D:
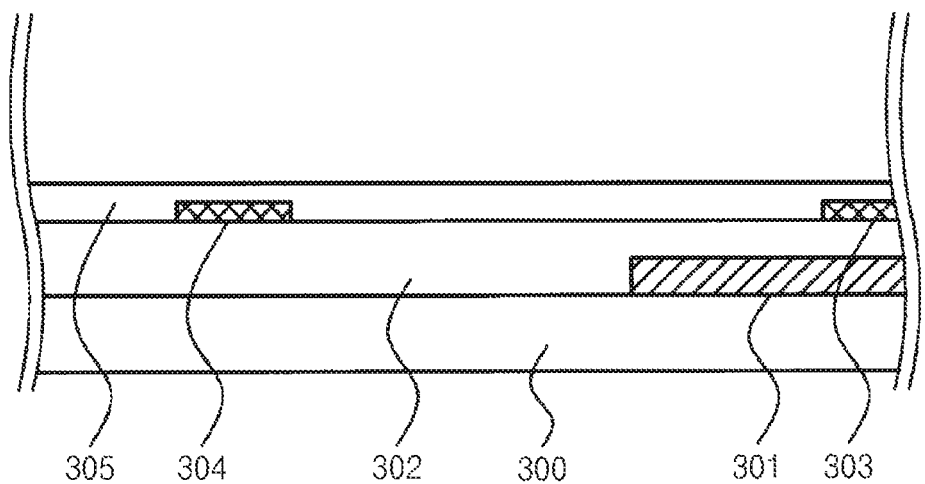
Figure 4E:
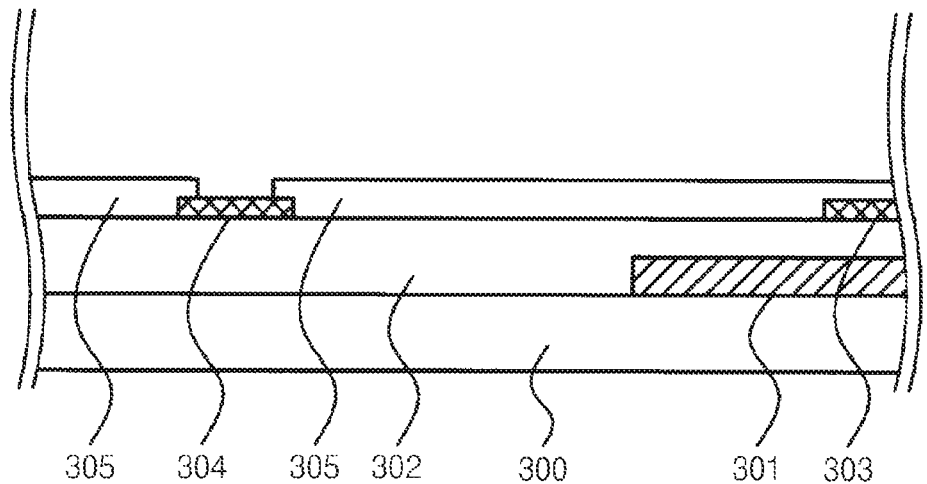
Figure 4F:
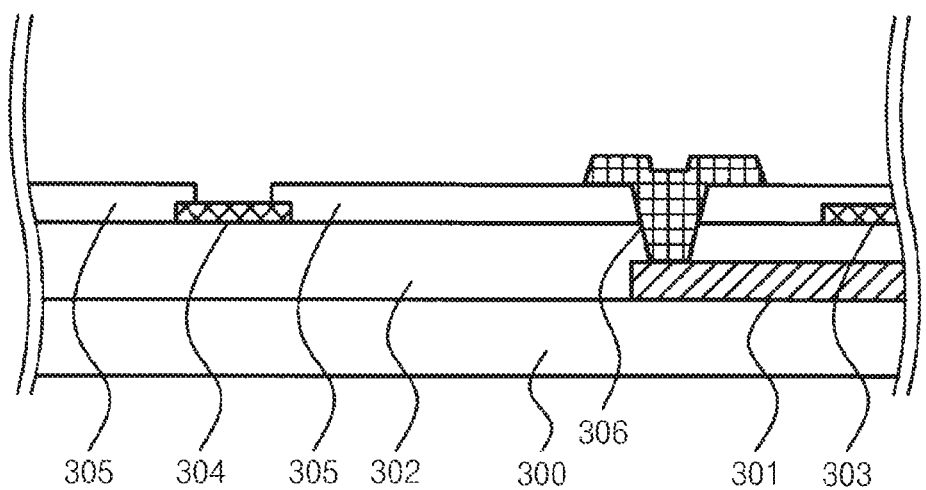
Figure 4G:
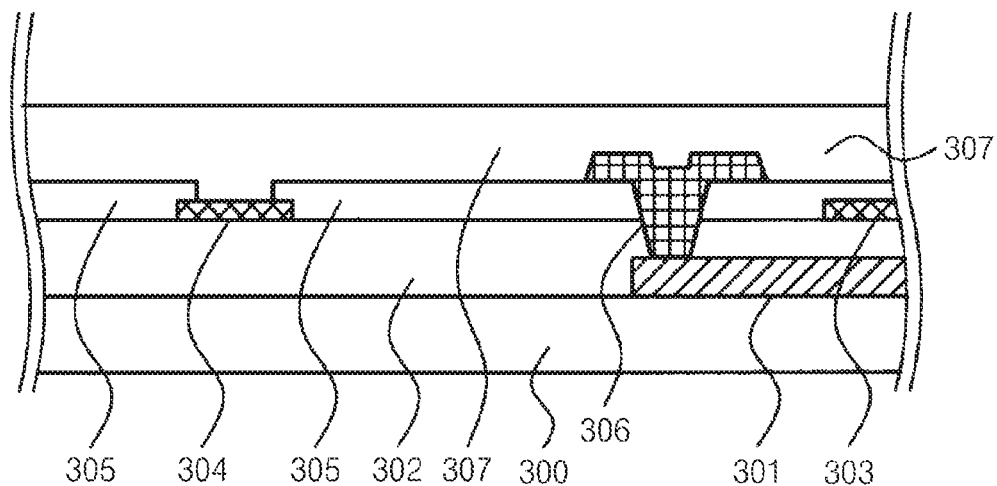
Figure 4H:
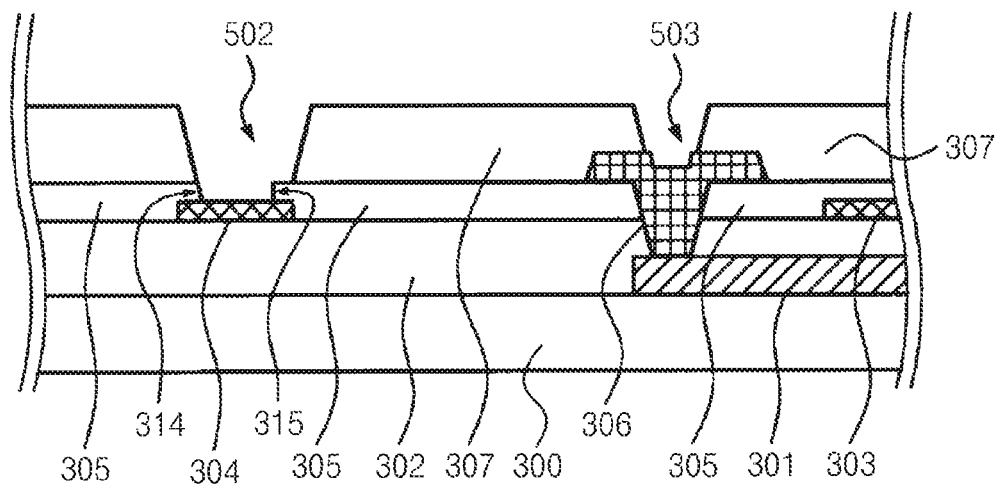
Figure 4I:
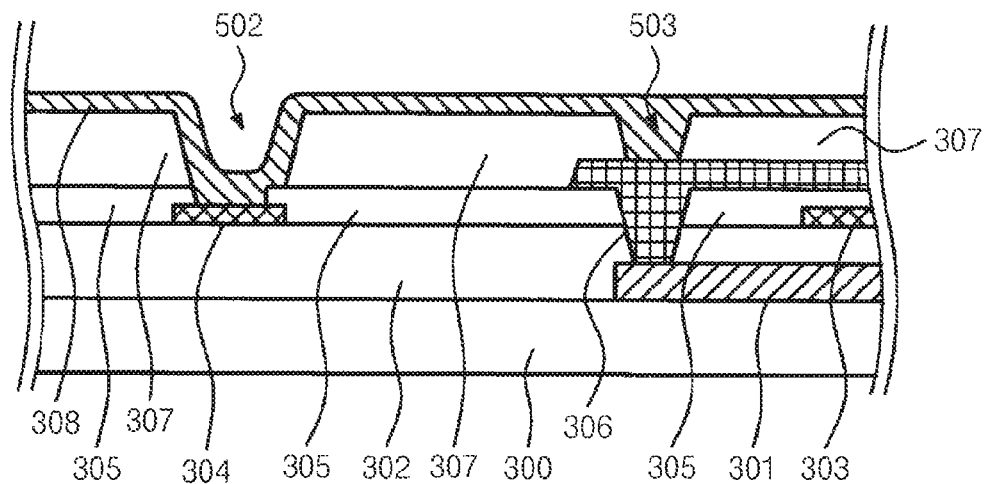
Figure 4J:
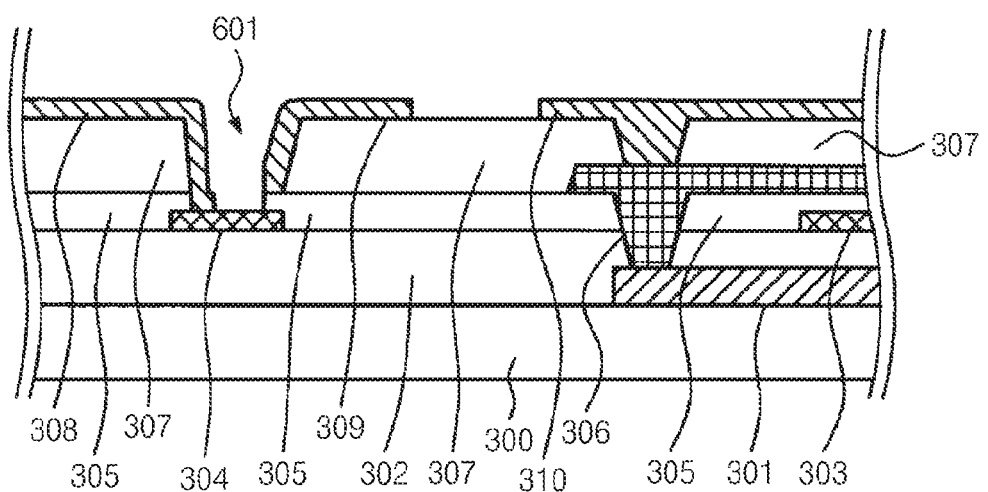
Figure 4K:
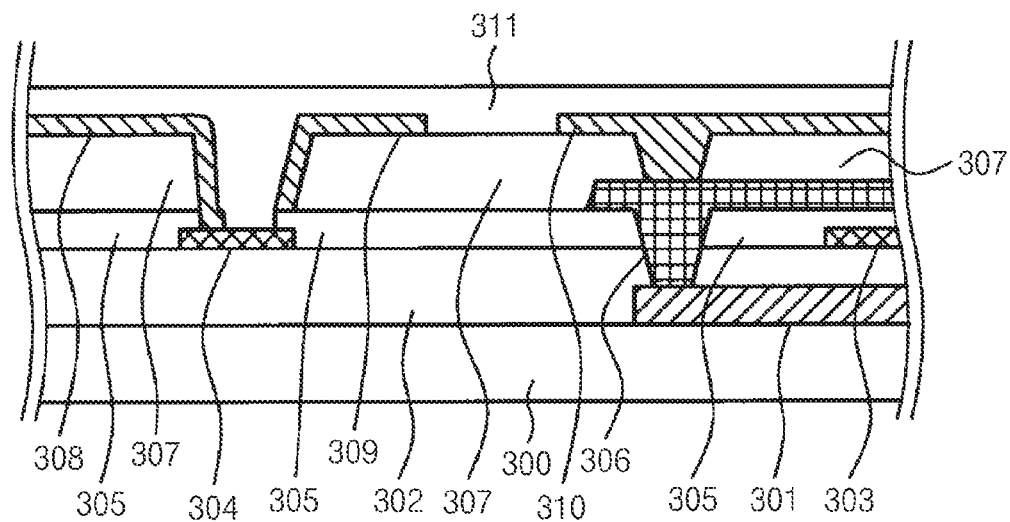
Figure 4L:
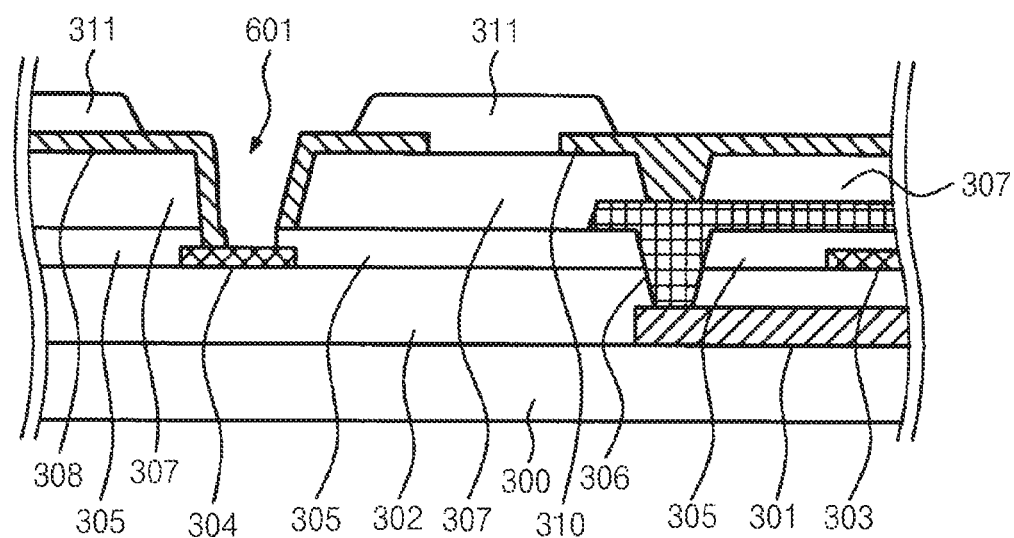
Figure 4M:
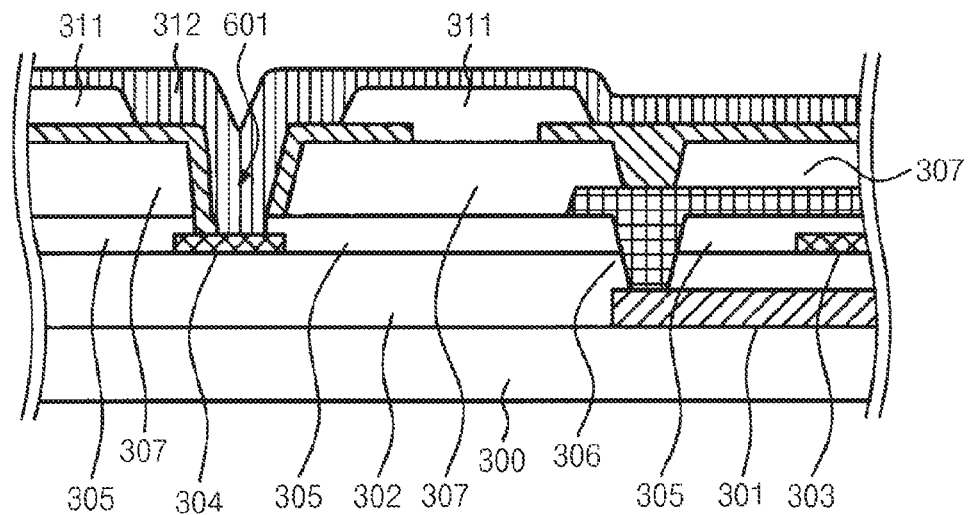
Figure 4N:
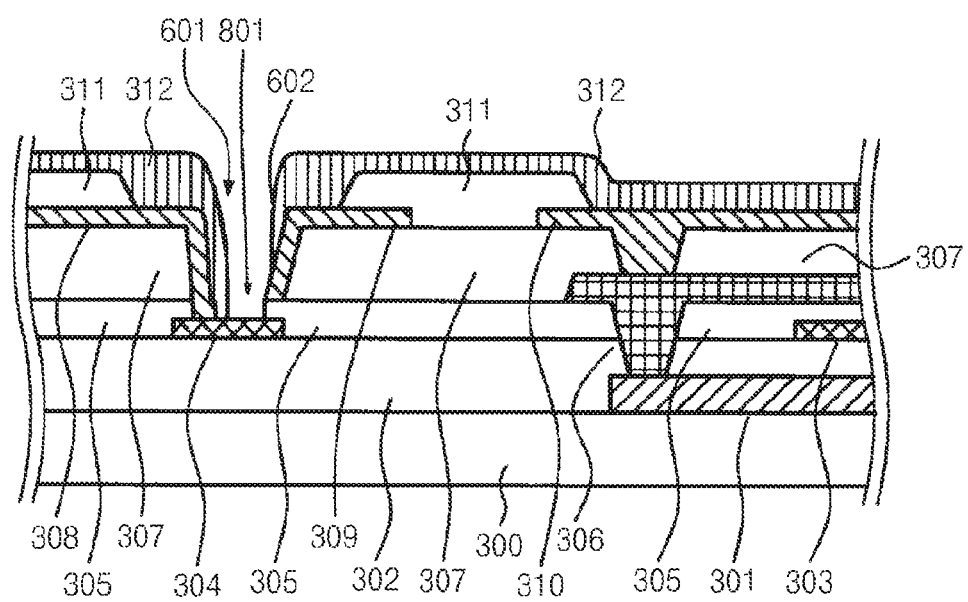
Figure 4O:
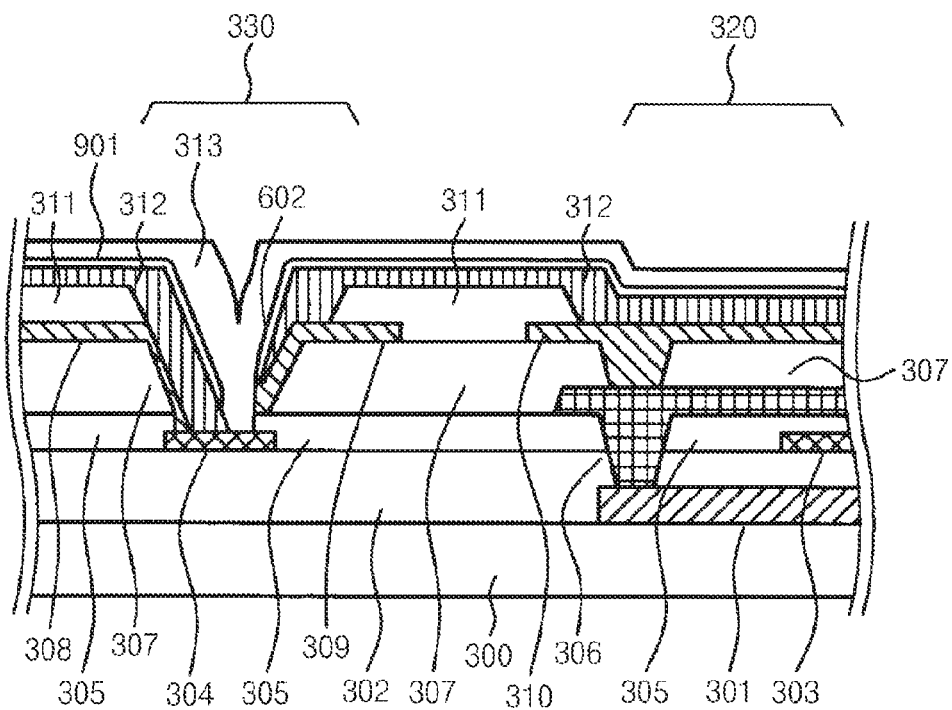
Figure 4P:
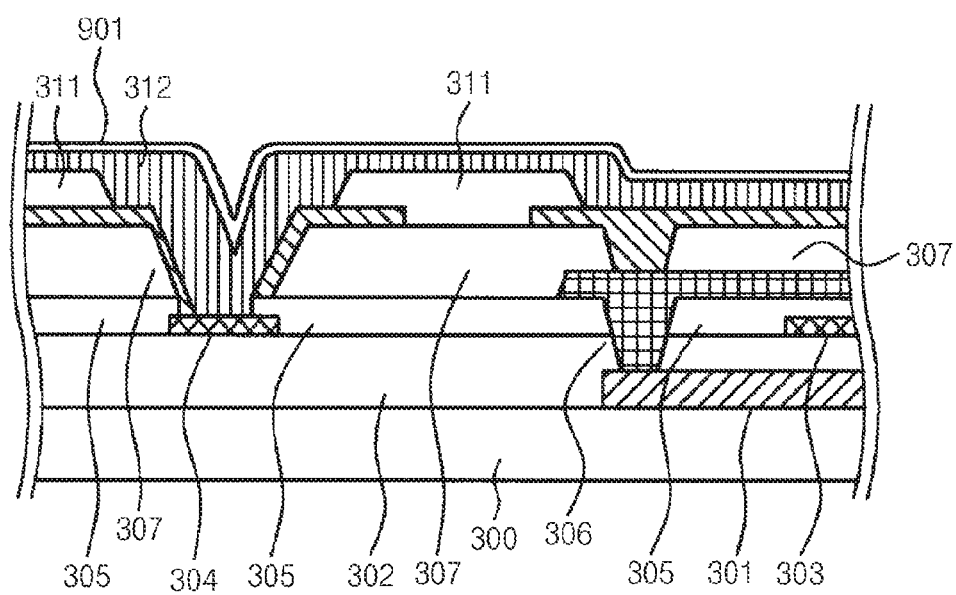

FIGS. 4A to 4P illustrate a process for manufacturing a display device according to an exemplary embodiment of the present inventive concept.

As illustrated in FIG. 4A, the semiconductor layer 301 is formed on the substrate 300. The semiconductor layer 301, may include, for example, polysilicon having a thickness of about 50 nm.

As illustrated in FIG. 4B, the gate insulating film 302 is disposed over the substrate 300 and the semiconductor layer 301, and the substrate 300 and semiconductor layer 301 are covered by the gate insulating film 302. The gate insulating film 302 may include silicon oxide having a thickness of about 100 nm.

As illustrated in FIG. 4C, the gate electrode 303 and the auxiliary electrode 304 are formed on the gate insulating film 302. The same material may be used for both the gate electrode 303 and the auxiliary electrode 304. For example, both the gate electrode 303 and the auxiliary electrode 304 may include a Mo-containing material having a thickness of about 150 nm.

As illustrated in FIG. 4D, the interlayer insulating film 305 may be disposed on and may cover the gate insulating film 302, the gate electrode 303, and the auxiliary electrode 304. The interlayer insulating film 305 may include silicon oxide having a thickness of about 300 nm.

As illustrated in FIG. 4E, an opening is formed in the interlayer insulating film 305 to expose the surface of the auxiliary electrode 304. Moreover, although a portion of the auxiliary electrode 304 surface is exposed in FIG. 4E, the opening in the interlayer insulating film 305 may also be provided such that the entire surface of the auxiliary electrode 304 is exposed.

As illustrated in FIG. 4F, a separate opening that corresponds to the boundary of the semiconductor layer 301 is formed in the interlayer insulating film 305, an opening that extends from the separate opening is provided in the gate insulating film 302, and the drain and source electrode 306 is formed. The electrode 306 may include Ti, having a thickness of about 100 nm, AlCu, having a thickness of about 450 nm, and Ti, having a thickness of about 100 nm, each laminated in sequence.

The operations corresponding to FIGS. 4E and 4F do not have to be performed in the described sequence. For example, in order to dispose the electrode 306, the opening in the gate insulating film 302 may be provided first, and then, after providing in the interlayer insulating film 305 the opening for exposing the surface of the auxiliary electrode 304 and the opening for forming and disposing the electrode 306, the electrode 306 may be formed and disposed.

As illustrated in FIG. 4G, the planarizing film 307 may be disposed on the gate insulating film 305, the opening in the auxiliary electrode 304, and the electrode 306. The planarizing film 307 may include polyimide having a thickness of about 2 μm.

As illustrated in FIG. 4H, the respective openings 502 and 503 for the surface of the auxiliary electrode 304 and the top surface of the electrode are formed. Here, in at least a portion of the bottom of the opening 503 in the auxiliary electrode 304, the interlayer insulating film 305 is exposed and the step-shaped form is created.

As illustrated in FIG. 4I, a material film 308 of both the auxiliary line and the pixel electrode is disposed on the planarizing film 307 and the openings 502 and 503. The material film 307 may be disposed, for example, by forming laminated layers of: an ITO layer having a thickness of about 10 nm as the bottom layer, a silver compound (AgPdCu) having a thickness of about 150 nm thereon, and an ITO layer having a thickness of about 10 nm as the top layer.

As illustrated in FIG. 4J, the material film 308 is patterned and an opening 601 is formed as the second opening 330. Thereby, the first auxiliary line 308, the second auxiliary line 309, and the pixel electrode 310 may be separated. For example, in the opening 601, the first auxiliary line 308 is electrically connected to the auxiliary electrode 304. Moreover, as describe above, in the opening 601, the second auxiliary line 309 is disposed to be spaced apart from the auxiliary electrode 304.

As illustrated in FIG. 4K, an insulating material film 311 is formed on the first auxiliary line 308, the second auxiliary line 309, the pixel electrode 310, and the planarizing film 307.

As illustrated in FIG. 4L, the insulating material film 311 is patterned and the pixel separation film is formed.

As illustrated in FIG. 4M, the organic light emitting layer 312 is formed on the pixel separation film 311, the first auxiliary line 308, the second auxiliary line 309, and the pixel electrode 310. Here, the organic light emitting layer 312 is also laminated inside of the opening 601.

Next, as illustrated in FIG. 4N, a connection opening 801 having the auxiliary electrode 304 as the base is formed. According to an exemplary embodiment of the present inventive concept, voltage is applied to the first auxiliary line 308 and the second auxiliary line 309, and the discharge effect is generated between the second auxiliary line 309 and the auxiliary electrode 304. Thereby, a portion of the organic light emitting layer 312 that is filled into the opening 601 dielectrically breaks down, and thus melts and evaporates to form the connection opening 801. A portion of the organic light emitting layer 312 may remain inside of the connection opening 801. Moreover, at least one of the first auxiliary line 308 or the second auxiliary line 309 may be exposed on a side wall of the connection opening 801.

In order to generate the discharge effect, a square wave voltage of which the frequency is about 1 kHz to about 100 kHz and the operating applied voltage is about 10 Vrms to about 100 Vrms may be applied to the first auxiliary line 308 and the second auxiliary line 309. The voltage of the applied square wave may be an alternating voltage of which the maximum value is a positive voltage and the minimum value is a negative voltage. The voltage of the applied square wave may also be a changing voltage of which the minimum value is at least 0, or may be a direct current (DC) voltage.

Moreover, in order to generate the discharge effect, it is not necessary to apply a voltage to all of the first auxiliary lines 308 and second auxiliary lines 309 at the same time. By dividing the display 100 into a plurality of areas, voltage may be applied concurrently or non-concurrently to the first auxiliary line 308 and second auxiliary line 309 in some areas.

Moreover, the insulating film disposed between the auxiliary electrode 304 and the second auxiliary line 309 may, in some cases, melt and evaporate due to the discharge effect.

Next, as illustrated in FIG. 4O, the top electrode 313 is formed. Here, part of the top electrode 313 may also be formed inside of the connection opening 801, for example, as illustrated in FIG. 4N, and the top electrode 313 may be electrically connected to at least one of the auxiliary electrode 304, the first auxiliary line 308, or the second auxiliary line 309.

Moreover, a plurality of the second openings 330 are formed. However, it is not necessary that in all of the second openings 330, the top electrode 304 is electrically connected to at least one of the first auxiliary line 308 or the second auxiliary line 309. Thus, there may be a case in which, in predetermined second openings 330, the electrode 313 is electrically connected to at least one of the auxiliary electrode 304, the first auxiliary line 308, or the second auxiliary line 309, but in other second openings 330 the electrode 313 is not connected electrically to any of the auxiliary electrode 304, the first auxiliary line 308, or the second auxiliary line 309.

The electrical connection may be formed thereafter, and the display panel 100 is sealed under an atmosphere of nitrogen, and the like. For sealing, the display panel 100 is covered with, for example, a transparent sealing glass. The substrate and the transparent sealing glass are sealed with UV-curable resin, and the like, and the organic electroluminescence display device is manufactured.

According to an exemplary embodiment of the present invention, as illustrated in FIG. 4P, a transparent conductive display panel 100 may be formed on the organic light emitting layer 312 illustrated in FIG. 4M before the discharge is generated between the second auxiliary line 309 and the auxiliary electrode 304. Thereby, a transparent conductive layer 901 is disposed between the organic light emitting layer 312 and the top electrode 313. The transparent conductive payer 901 may include Ca having a thickness of about 2 nm or MgAg (Mg:Ag=10:1) having a thickness of about 2.5 nm.

Figure 5:
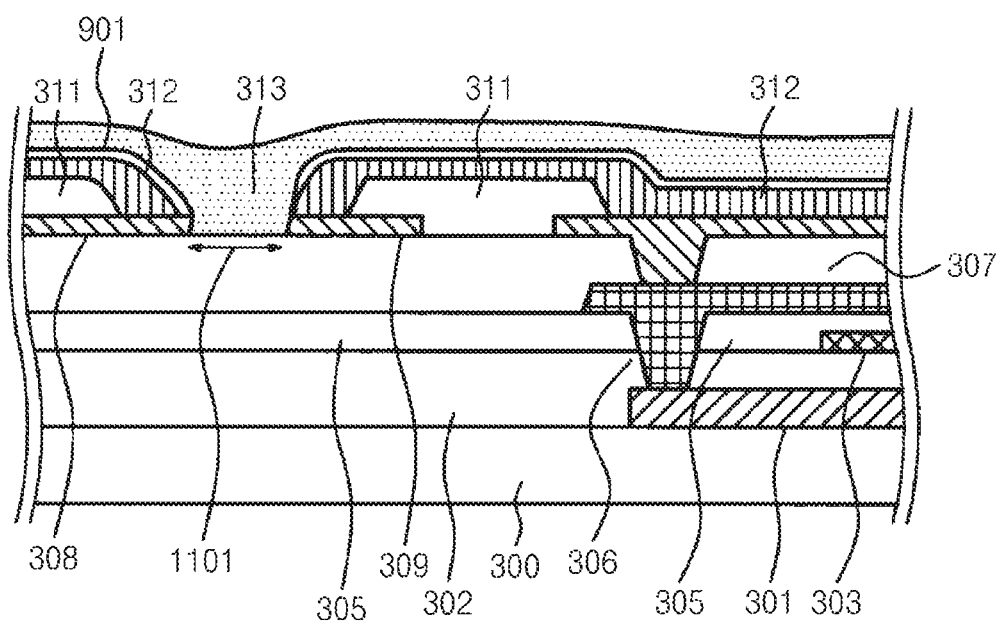
FIG. 5 is a diagram illustrating a process for manufacturing a display device according to an exemplary embodiment of the present inventive concept.

FIG. 5 is a cross-sectional view along IV-IV' in FIG. 2 according to an exemplary embodiment of the present invention. As illustrated in FIG. 5, in the second opening 330, the auxiliary electrode is not formed and the opening for exposing the top surface of the auxiliary electrode to the interlayer insulating film 305 and the planarizing layer 307 is not provided. Instead, an end of the first auxiliary line 308 and an end of the second auxiliary line 309 face each other on the planarizing layer 307. Consequently, the discharge effect may be generated between the end of the first auxiliary line 308 and the end of the second auxiliary line 309; the organic light emitting layer 312 and, if necessary, the transparent conductive layer 901 may be removed; and the first auxiliary line 308 and the second auxiliary line 309 may be electrically connected to the top electrode 313.

According to an exemplary embodiment of the present invention, the distance 1101 separating the end of the first auxiliary line 308 from the end of the second auxiliary line 309 is dependent on the precision of the lithography. Accordingly, the distance 1101 may be about 1 µm to about 20 µm. Therefore, when compared to the approach discussed above with reference to FIGS. 1 through 4P, in order to generate the discharge effect, a higher voltage may be applied to the first auxiliary line 308 and the second auxiliary line 309, for a longer duration of time.

According to the configuration discussed above with reference to FIGS. 1 through 4P, a pixel circuit, which is a planar-type thin film transistor (TFT) that uses low temperature polysilicon and has a vertical-horizontal resolution of 136 pixels×904 pixels with a pixel pitch of 145 µm, may be formed on a glass substrate. In manufacturing the TFT, the polysilicon (50 nm), a gate insulating film (SiO2: 100 nm), a gate line (Mo: 150 nm), an interlayer insulating film (SiO2: 300 nm), and a source/drain line (Ti: 100 nm/AlCu: 450 nm/Ti: 100 nm) may be formed in sequence, and then patterning may be performed. The pixel circuit may be formed in accordance with the auxiliary electrode by using the gate line. Then, a polyimide planarization film (film thickness 2 µm) may be formed in order to flatten the concave-convex pattern of the line pattern; a through-hole that is a connecting part between the pixel circuit and a below-described pixel area, and is a second opening that reaches the auxiliary electrode may be formed; and patterning may be performed to enable connection to an upper layer.

Next, a bottom layer of indium tin oxide (ITO, film thickness 10 nm), a silver alloy (AgPdCu, film thickness 150 nm), and a top layer of ITO (film thickness 10 nm) may be laminated in sequence, patterning may be performed, and the pixel electrode, an auxiliary line, and a power connection electrode may be formed. Here, the auxiliary line may be formed by dividing into a first auxiliary line and a second auxiliary line, and only the first auxiliary line may be connected to the auxiliary electrode. Finally, polyimide may be formed as a film and patterned as a pixel separation film to expose an opening for the pixel (a first opening), and a connecting part between the auxiliary line and the top electrode (the second opening). Moreover, one second opening may be formed for one pixel. Here, the first auxiliary electrode and the second auxiliary electrode may be formed to include, outside of the display area, a pad part for applying voltage, and in a later process, a voltage was applied between the first auxiliary electrode and the second auxiliary electrode. The power connection electrode may also be formed outside of the display area. When a discharge electrode is formed by using the gate line layer as above, the distance by which the auxiliary electrode is spaced apart from the second auxiliary line (hereinafter referred to as a discharge GAP) may be reduced to about 300 nm, which is equivalent to the film thickness of the interlayer insulating film that is provided between the gate line and the source/drain line.

Next, after oxygen plasma treatment is performed on the surface of the insulating layer, the organic light emitting layer may be formed through a vacuum deposition method. Moreover, the organic light emitting layer may be formed by laminating in sequence, from the bottom, a 4,4',4"-Tris(3-methyl-phenylphenylamino)tri-phenylamine (m-MTDATA) layer (film thickness of 50 nm), a n,n-di(naphthalene-1-yl)-n,n-diphenyl-benzidene (NPB) layer (film thickness of 70 nm), a light emitting layer (film thickness of 30 nm), a tris(8-hydroxyquinolinato)aluminium (Alq3) layer (film thickness of 30 nm), and a LiF layer (film thickness of 1 nm). Moreover, by using a mask, the organic light emitting layer may be formed on only the display area, and need not be formed outside of the display area, such as on a pad part configured for applying voltage.

A transparent conductive layer may be formed with Ca (film thickness of 2 nm), MgAg (Mg:Ag=10:1) through a vacuum deposition method. Here, a pattern may be formed by using a mask such that the transparent conductive layer also has the pad part configured for applying voltage.

Next, under a nitrogen atmosphere, the pad part may be used to apply a square wave voltage between the two auxiliary lines. The frequency of the applied square wave voltage may be 10 kHz. Due to such an application of voltage, a discharge caused by dielectric breakdown may be generated between the auxiliary electrode and the two auxiliary lines; and it may be observed that in a portion of the second opening, portions of the organic light emitting layer and the transparent conductive layer are being melted and thus removed.

In the separate second opening inside of the display, although not a clear removal of the organic film, there may be traces of the auxiliary line of the bottom layer melted by electrical energy, and another area may be formed in which the organic layer of the top part is mixed therein. Moreover, MgAg (Mg:Ag=10:1) may be formed as a second transparent conductive layer through a vacuum deposition method to have a film thickness of 9.5 nm, and may be connected to the power connection electrode, the auxiliary line, and the first conductive layer. Next, under a nitrogen atmosphere, the display area of the substrate may be covered with a transparent sealing glass, and the substrate and transparent sealing glass may be sealed by adhering with a UV-curable resin.

Consequently, the discharge GAP of the configured pixel circuit may be 300 nm (0.3 μm).

However, according to a configuration of a pixel circuit in a display device described above with respect to FIG. 5, instead of forming the auxiliary electrode, an end of the first auxiliary line 308 may face an end of the second auxiliary line 309 on the flattening film 307.

Consequently, three pixel circuits may be configured of which the distances 1101 (discharge GAP) separating the end of the first auxiliary line 308 and the end of the second auxiliary line 309 may be 2.5 μm, 4.0 μm, and 6.0 μm, respectively.

FIG. 6 is a chart illustrating a comparative evaluation of the display devices of FIGS. 1-4P and 5, respectively. For the purposes of this illustration, the approach described above with respect to FIGS. 1-4P is identified as "Embodiment of example: First" while the approach described above with respect to FIG. 5 is identified as "Embodiment of example: Second" and here, various different discharge gap lengths are shown.

FIG. 6 is a chart illustrating, in the order from the second column to the fifth column, the voltage applied to the first auxiliary line and the second auxiliary line ("Applied Voltage"), the opening fraction in the organic light emitting layer that is due to the discharge effect ("Opening Fraction"), the maximum opening diameter of the opening generated in the organic light emitting layer due to the discharge effect ("Maximum Opening Diameter"), and the existence or lack thereof of deficiencies caused by the opening when emitting light ("Emission Deficiency") for each of the above-described discharge GAP of 0.3 μm (First), discharge GAP of 2.5 μm (Second), discharge GAP of 4.0 μm (Second), and discharge GAP of 6.0 μm (Second), which are displayed in order from the second row to the fifth row.

Applied voltage may indicate the maximum value of the square wave applied to the first auxiliary line and the second auxiliary line in order to generate the discharge effect. Opening fraction indicates the percentage obtained by dividing the number of second openings, in which an electrical connection was realized between the top electrode and any one or both of the first auxiliary line and the second auxiliary line, with the total number of second openings. Maximum opening diameter indicates the maximum opening diameter of the second opening, in which an electrical connection was realized between the top electrode and any one or both of the first auxiliary line and the second auxiliary line, when viewed from above the substrate. Emission deficiency is defined as the occurrence of any one of a non-emitting pixel or an irregularity in brightness when electrons are provided to the top electrode through the first auxiliary line and the second auxiliary line.

Referring to FIG. 6, within the "First" approach, the applied voltage may be 30 V, and, although the smallest, an opening fraction of 50% could be obtained, and the maximum opening diameter may be the smallest. A small maximum opening diameter indicates that the distance between the opening and the pixel may be small. Thus, a small maximum opening diameter indicates suitability for enlargement and densification of the pixels. Moreover, since the amount of the material in the organic light emitting layer that is scattered due to the discharge effect is reduced, the occurrence of emission deficiencies may be suppressed.

For the "Second" approach, the opening fraction may be 0% when the applied voltage is 30 V.

Moreover, in the case where the electrical connection is randomly realized in the second opening, when the opening fraction of about 2% to 8% or greater is obtained, irregularities in brightness are not perceived, and thus it may be observed that there are no practical limitations.

According to an exemplary embodiment of the present inventive concept, a manufacturing method for connecting an auxiliary line to a top electrode is simplified.

Although exemplary embodiments of the present invention have been described above with reference to the figures, it is understood that the present invention should not be limited to these exemplary embodiments but various changes and modifications can be made by one ordinary skilled in the art.

What is claimed is:

1. A display device, comprising:
   a substrate;
   a pixel electrode disposed on the substrate;
   an auxiliary electrode disposed on the substrate;
   a first auxiliary line connected to the auxiliary electrode;
   a second auxiliary line spaced apart from the auxiliary electrode;
   a top electrode contacting at least one of the auxiliary electrode, the first auxiliary line, or the second auxiliary line; and
   an organic light emitting layer disposed between the top electrode and the pixel electrode, disposed between the top electrode and the first auxiliary line, and disposed between the top electrode and the second auxiliary line.

2. The display device of claim 1, wherein an insulating layer is disposed between the second auxiliary line and the auxiliary electrode.

3. The display device of claim 1, further comprising a transparent conductive layer disposed between the organic light emitting layer and the top electrode.

4. The display device of claim 1, wherein a distance between the second auxiliary line and the surface of the auxiliary electrode that is adjacent to the second auxiliary line is about 50 nm to about 2 μm.

5. The display device of claim 1, wherein the first auxiliary line and the second auxiliary line are spaced apart from each other and are each aligned in parallel with the substrate, and wherein at least a portion of the organic light emitting layer is disposed between the first auxiliary line and the second auxiliary line.

6. The display device of claim 1, wherein the first auxiliary line and the second auxiliary line are formed of a same material as the pixel electrode, and are formed on a same layer as the pixel electrode.

7. The display device of claim 1, further comprising a transistor including a gate electrode, a source electrode, and a drain electrode, wherein the auxiliary electrode is formed of a same material and on a same layer as one of the gate electrode, the source electrode, or the drain electrode.

8. The display device of claim 1, further comprising a transistor including a gate electrode and a semiconductor layer that is spaced apart from the gate electrode, wherein the semiconductor layer is composed of a semiconductor material, wherein the auxiliary electrode includes the semiconductor material, and wherein the semiconductor material of the auxiliary electrode is doped.

9. The display device of claim 1, further comprising one or more insulating films disposed between the auxiliary electrode and the first auxiliary line, and disposed between the auxiliary electrode and the second auxiliary line, wherein: the top electrode is connected, through an opening, to at least one of the auxiliary electrode, the first auxiliary line, or the second auxiliary line, and the top electrode is disposed in the one or more insulating films and the organic light emitting layer; and the opening exposes the auxiliary line.

10. The display device of claim 2, wherein the second auxiliary line is disposed on the auxiliary electrode, and wherein the top surface of the insulating layer contacts the second auxiliary line.

11. The display device of claim 10, wherein at least a portion of the second auxiliary line vertically overlaps the auxiliary electrode.

12. A method for manufacturing a display device, comprising:
forming a pixel electrode on a substrate;
forming an auxiliary electrode on the substrate;
forming a first auxiliary line that is connected to the auxiliary electrode;
forming a second auxiliary line that is spaced apart from the auxiliary electrode;
forming an organic light emitting layer on the pixel electrode, the auxiliary electrode, the first auxiliary line, and the second auxiliary line;
generating a discharge effect between the auxiliary electrode and the second auxiliary line; and
forming a top electrode contacting at least one of the auxiliary electrode, the first auxiliary line, or the second auxiliary line.

13. The method of claim 12, further comprising forming an interlayer insulating film between the second auxiliary line and the auxiliary electrode.

14. The method of claim 12, wherein the generating of the discharge effect comprises dielectrically breaking down a portion of the organic light emitting layer that is adjacent to the second auxiliary line to form an opening exposing at least a portion of the auxiliary line.

15. The method of claim 12, wherein a distance between the second auxiliary line and a surface of the auxiliary electrode is about 50 nm to about 2 µm.

16. The method of claim 14, wherein the generating of the discharge effect further comprises applying a voltage to the first auxiliary line and the second auxiliary line to dielectrically break down the organic light emitting layer.

17. A display device, comprising:
a substrate;
a source/drain electrode disposed on the substrate;
a planarizing layer disposed over the source/drain electrode;
a pixel electrode disposed over the planarizing layer, the pixel electrode electrically contacting the source/drain electrode through a hole in the planarizing layer;
a first auxiliary line disposed on the planarizing layer;
a second auxiliary line disposed on the planarizing layer, and spaced apart from the first auxiliary line by a space;
an organic light emitting layer disposed over, and electrically contacting, the first auxiliary line, the second auxiliary line, and the pixel electrode; and
a top electrode disposed over the organic light emitting layer and contacting the first and second auxiliary lines through the space between the first and second auxiliary lines; and
a transparent conductive layer disposed between the organic light emitting layer and the top electrode.

18. The display device of claim 17, further comprising:
a semiconductor layer disposed on the substrate;
a gate insulating film covering the substrate and the semiconductor layer;
a gate electrode disposed on the gate insulating film; and
an interlayer insulation film disposed over the gate electrode and the gate insulating film,
wherein the source/drain electrode is disposed on the interlayer insulation film and the source/drain electrode electrically contacts the semiconductor layer through a hole in the interlayer insulation film.

19. The display device of claim 17, wherein the transparent conductive layer comprises a thin metal film or a transparent conductive oxide.

20. The display device of claim 17, wherein the distance is in a range of between 50 nm to 2 µm.

* * * * *